(12) United States Patent
Godil et al.

(10) Patent No.: US 6,826,330 B1
(45) Date of Patent: Nov. 30, 2004

(54) DYNAMIC SPECTRAL SHAPING FOR FIBER-OPTIC APPLICATION

(75) Inventors: Asif A. Godil, Mountain View, CA (US); David M. Bloom, Palo Alto, CA (US)

(73) Assignee: LightConnect, Inc., Newark, CA (US)

( * ) Notice: Subject to any disclaimer, the term of this patent is extended or adjusted under 35 U.S.C. 154(b) by 0 days.

(21) Appl. No.: 09/549,781

(22) Filed: Apr. 14, 2000

Related U.S. Application Data

(63) Continuation-in-part of application No. 09/548,788, filed on Apr. 13, 2000, now Pat. No. 6,501,600, and a continuation-in-part of application No. 09/372,712, filed on Aug. 11, 1999, now abandoned, and a continuation-in-part of application No. 09/372,649, filed on Aug. 11, 1999, now Pat. No. 6,169,624.

(60) Provisional application No. 60/171,685, filed on Dec. 21, 1999.

(51) Int. Cl.$^7$ ................................................ G02B 6/34
(52) U.S. Cl. ........................ 385/37; 385/10; 385/33
(58) Field of Search ............................ 385/33, 37, 10, 385/31, 129

(56) References Cited

U.S. PATENT DOCUMENTS

| | | | |
|---|---|---|---|
| 3,904,295 A | * 9/1975 | Hock et al. ............. 250/237 R |
| 4,973,159 A | * 11/1990 | Sohma et al. ............ 356/315 |
| 5,311,360 A | 5/1994 | Bloom et al. ............ 359/572 |
| 5,414,540 A | * 5/1995 | Patel et al. ............. 349/196 |
| 5,526,155 A | * 6/1996 | Knox et al. ............... 398/87 |
| 5,629,801 A | 5/1997 | Staker et al. | |
| 5,661,592 A | 8/1997 | Bornstein et al. | |
| 5,701,005 A | * 12/1997 | Meyers ................... 250/208.1 |
| 5,731,802 A | 3/1998 | Aras et al. | |
| 5,745,271 A | 4/1998 | Ford et al. ............... 359/130 |
| 5,764,280 A | 6/1998 | Bloom et al. | |
| 5,793,912 A | 8/1998 | Boord et al. ............... 385/37 |
| 5,798,743 A | 8/1998 | Bloom | |
| 5,805,759 A | 9/1998 | Fukushima ............... 385/140 |
| 5,808,797 A | 9/1998 | Bloom et al. | |
| 5,841,579 A | 11/1998 | Bloom et al. | |
| 5,847,863 A | * 12/1998 | Galvanauskas et al. ..... 359/333 |

(List continued on next page.)

FOREIGN PATENT DOCUMENTS

| | | | |
|---|---|---|---|
| EP | 0 555 778 A2 | 8/1993 | ............ H01S/3/25 |
| EP | 0654917 A2 | 5/1995 | ............ H04J/14/02 |
| WO | WO 99/38348 | 7/1999 | ............ H04Q/11/00 |

OTHER PUBLICATIONS

Parker, Michael C. "Dynamic Digital Holographic Wavelength Filtering", Journal of Lightwave Technology, vol. 16, No. 7, Jul. 1998.

(List continued on next page.)

Primary Examiner—Frank G. Font
Assistant Examiner—Kevin Kianni
(74) Attorney, Agent, or Firm—James E. Eakin

(57) ABSTRACT

The present invention is directed towards dynamic spectral shaping. Using a grating, the spectral band is spread across a MEMS or other suitable device array. The device may be the deformable grating modulator invented by Bloom et. al. (U.S. Pat. No. 5,311,360) or other suitable device. The invention also includes the coupling in and out of the fiber and may use polarization optics to ensure the grating is used in only one polarization where the diffraction efficiency is higher.

15 Claims, 5 Drawing Sheets

U.S. PATENT DOCUMENTS

| | | | |
|---|---|---|---|
| 5,943,158 A | | 8/1999 | Ford et al. .................. 359/295 |
| 5,946,128 A | * | 8/1999 | Paek .......................... 359/130 |
| 5,982,553 A | | 11/1999 | Bloom et al. |
| 5,986,634 A | | 11/1999 | Alioshin et al. |
| 5,987,200 A | * | 11/1999 | Fleming et al. .............. 385/37 |
| 5,995,281 A | * | 11/1999 | Simon et al. ............... 359/368 |
| 6,004,912 A | | 12/1999 | Gudeman |
| 6,038,057 A | * | 3/2000 | Brazas et al. .............. 359/291 |
| 6,064,404 A | | 5/2000 | Aras et al. |
| 6,069,576 A | | 5/2000 | Gwin |
| 6,088,102 A | | 7/2000 | Manhart |
| 6,101,036 A | | 8/2000 | Bloom |
| 6,130,770 A | | 10/2000 | Bloom |
| 6,141,361 A | * | 10/2000 | Mears et al. ................ 359/237 |
| 6,147,341 A | * | 11/2000 | Lemaire et al. ........ 250/227.17 |
| 6,178,284 B1 | | 1/2001 | Bergmann et al. |
| 6,215,579 B1 | | 4/2001 | Bloom et al. |
| 6,251,842 B1 | | 6/2001 | Gudeman |
| 6,268,948 B1 | * | 7/2001 | Gelbart ...................... 347/135 |
| 6,268,952 B1 | * | 7/2001 | Godil et al. ................ 359/291 |
| 6,271,808 B1 | | 8/2001 | Corbin |
| 6,275,623 B1 | * | 8/2001 | Brophy et al. ................ 385/14 |
| 6,285,500 B1 | * | 9/2001 | Ranalli et al. .............. 359/127 |
| 6,327,398 B1 | * | 12/2001 | Solgaard et al. ............. 385/17 |
| 6,342,966 B1 | * | 1/2002 | Button et al. ............... 359/143 |
| 6,357,913 B1 | * | 3/2002 | Kim et al. .................. 359/115 |
| 6,453,095 B2 | * | 9/2002 | Feng et al. ................... 385/37 |

OTHER PUBLICATIONS

Wang, Lei and Weiner, A.M. "Programmable Spectral Phase Coding of an Amplified Spontaneous Emission Light Source", Optics Communications, 167 (1999) 211–224, Aug. 15, 1999.

Ford, Joseph E. and Walker, James A. "Dynamic Spectral Power Equalization Using Micro–Opto–Mechanics", IEEE Photonics Technology Letters, vol. 10, No. 10, Oct. 1998.

* cited by examiner

400

DYNAMIC SPECTRAL SHAPING FOR FIBER-OPTIC APPLICATION

RELATED APPLICATIONS

The present invention is a continuation in part of Ser. No. 09/372,712, filed Aug. 11, 1999, now abandoned and a continuation in part of Ser. No. 09/372,649, filed Aug. 11, 1999 now U.S Pat. No. 6,169,624, and a continuation in part of provisional application Ser. No. 60/171,685 filed Dec. 21, 1999, and a continuation in part of Ser. No. 09/548,788 filed Apr. 13, 2000, now U.S. Pat. No. 6,501,600, all of which applications are incorporated herein by reference.

BACKGROUND OF THE INVENTION

1. Field of the Invention

The present invention relates to dynamically shaping the spectral response with high resolution for fiber-optic applications. More particularly, the present invention relates to dynamic gain or channel equalization for erbium doped fiber amplifiers (EDFA) used in WDM networks.

2. Description of Related Art

The EDFA gain is highly non-uniform across the EDFA spectral band. Therefore gain flattening is an important part of good EDFA design and operation. Presently this is accomplished using a static gain flattening filter based on thin film filter technology or more recently on fiber bragg gratings. The dynamic aspect is covered by using a variable optical attenuator between the two stages of an EDFA.

However the previous approach is inadequate for very long links where cascading of many EDFAs and components cannot ensure adequate spectral flatness. In addition, for dynamically reconfigurable networks a static approach is inadequate. Therefore there is a need for dynamically shaping the spectral response at various points in the network for maintaining adequate end to end spectral flatness. A device for accomplishing this was invented by B. Y. Kim and others based on exciting an acoustic flexure wave along the length of a bare fiber. However this approach gives limited spectral control and the bare fiber is affected by shock and vibration. Work done at Lucent is based on spreading the wavelengths in space using a grating, followed by an array of MARS (mechanical anti-reflection switch) micromechanical modulators. This approach is limited by the fabrication difficulty and performance limitation of the MARS device.

Accordingly, there is a need for a simple but powerful means of dynamic spectral shaping. The ideal system should have low insertion loss, fine spectral resolution, large dynamic range, low polarization dependent loss (PDL) and simple control.

SUMMARY OF THE INVENTION

An object of the present invention is to provide controllable transmission in a communications system.

Another object of the present invention is to provide controllable transmission in a communications system as a function of wavelength.

A further object of the present invention is to provide controllable compensation for the wavelength dependent gain of EDFA's.

Yet another object of the present invention is to provide controllable and dynamic compensation for the dynamic wavelength dependent gain of EDFA's.

These and other objects of the present invention are achieved in a dynamic spectral shaping device with a controllable transmission as a function of wavelength that includes a fiber optic input port providing an input beam. A wavelength dispersive element is coupled to the input port. The wavelength dispersive element spreads the input beam in at least one dimension as a function of wavelength and generates a dispersed beam. A controllable grating reflects the dispersed beam to the wavelength dispersive element and generates a recombined beam. The controllable grating provides a controllable reflectivity as a function of wavelength. A fiber optic output port is positioned to receive the recombined beam.

In another embodiment of the present invention, an optical system includes an EDFA system with at least one amplifier stage. A spectral shaping device is coupled to the EDFA system. The spectral shaping device includes a fiber optic input port that provides an input beam. A wavelength dispersive element is coupled to the input port. The wavelength dispersive element spreads the input beam in at least one dimension as a function of wavelength and generates a dispersed beam. A controllable grating reflects the dispersed beam to the wavelength dispersive element and generates a recombined beam. The controllable grating provides a controllable reflectivity as a function of wavelength. A fiber optic output port is positioned to receive the recombined beam. The optical system provides a desired controllable wavelength flatness.

In another embodiment of the present invention, an optical system includes a fiber optic input port providing an input beam and a wavelength dispersive element coupled to the input port. The wavelength dispersive element spreads the input beam in at least one dimension as a function of wavelength and generates a dispersed beam. A controllable grating reflects the dispersed beam to the wavelength dispersive element and generates a recombined beam. The controllable grating provides a controllable reflectivity as a function of wavelength. A fiber optic output port is positioned to receive the recombined beam. An EDFA is coupled to the fiber optic input port. The optical system provides a desired controllable wavelength flatness.

DETAILED DESCRIPTION OF THE INVENTION

Figure 1A:
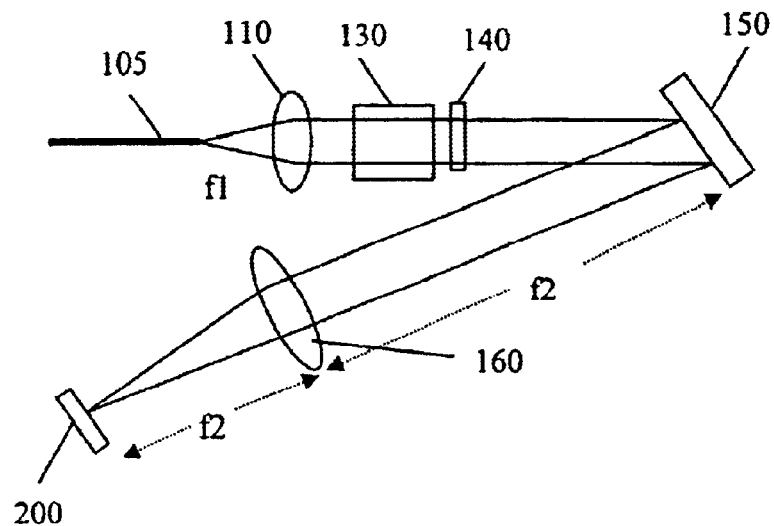
FIG. 1(a) is a schematic top view of one embodiment of an optical system of the present invention that is utilized for dynamic spectral shaping.
Figure 1B:
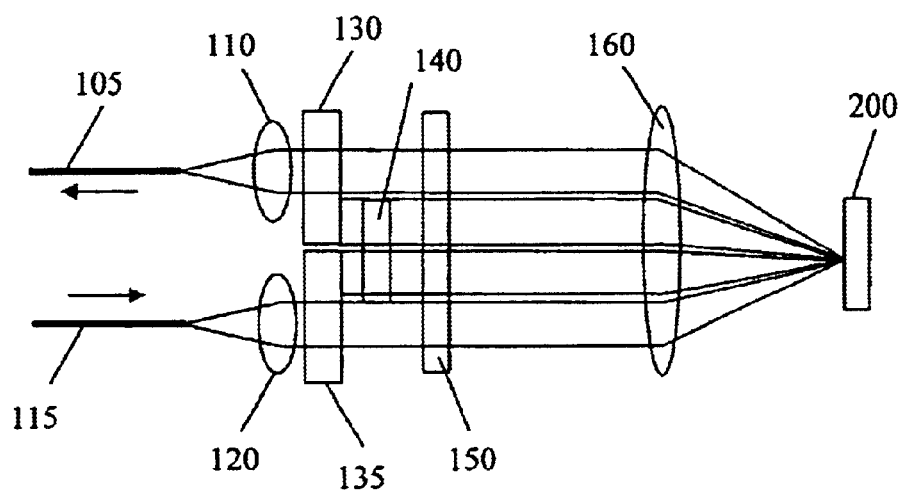
FIG. 1(b) is a schematic side view of the FIG. 1(a) optical system.

FIG. 1 illustrates one embodiment of an optical system 100 of the present invention for the dynamic spectral shaping. Its comprised of an input optical fiber 105, an output optical fiber 115, an input collimating lens 110 of focal length f1, an output collimating lens 120 of focal length f1, a walkoff birefringent plate 130 on the input side, a walkoff birefringent plate 135 on the output side, a half wave plate 140, a grating 150 to diffract the light onto a focusing lens 160 of focal length f2, and then onto the device array 200.

The broadband light from the input optical fiber 105 is collimated by lens 110 which may be a GRIN lens, spherical lens or any other suitable lens. The collimated light passes through a walkoff birefringent plate 130 such as YVO4, calcite or LiNbO3. The ordinary polarization goes straight through while the extraordinary polarization is displaced downwards by an amount, which if designed properly, should be greater than the beam size. The polarization of one of the displaced beams is rotated by using a half wave plate (HWP) 140 and made the same as the other beam. Now both beams are either vertically or horizontally polarized. The polarization direction is chosen to maximize the diffraction efficiency of the grating 150 which may be a holographic grating or a blazed grating. Two parallel beams impinge on the grating which diffracts the light towards the upper half of a focusing lens 160 of focal length f2 which is placed a distance f2 away from the grating. This telecentric use walks the focused beam across the device array 200 as a function of wavelength. The two polarization paths come together on the device array which is segmented to cover different spectral slices. The reflected light from the device goes through the bottom half of the lens 160 and impinges on the grating which puts all the wavelengths back to gather. The polarization is combined again using the HWP and the output birefringent plate 135 which is oriented opposite from the input birefringent plate. The beam is focused into the output fiber 115 using another collimating lens 120.

Figure 2A:
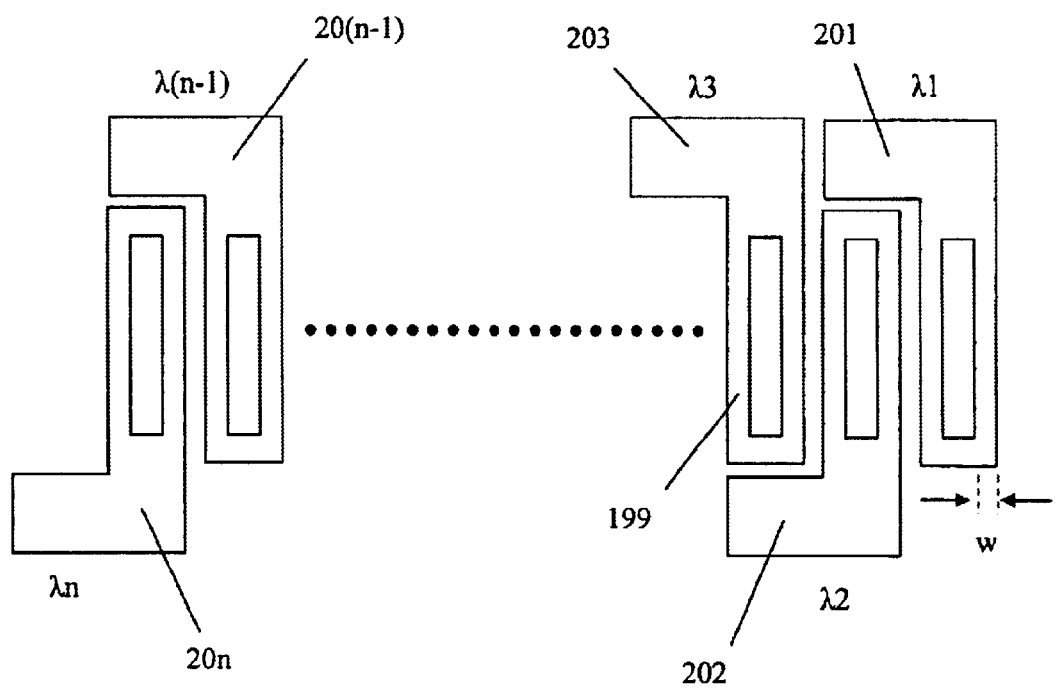
FIG. 2(a) is a schematic top view of a deformable grating, modulator array utilized in one embodiment of the present invention.
Figure 2B:
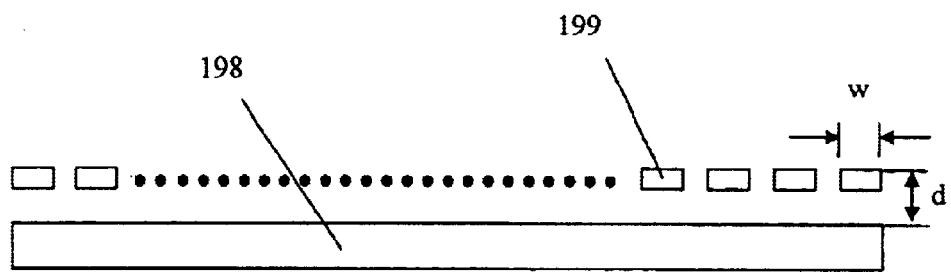
FIG. 2(b) is a schematic side view of the FIG. 2(a) deformable grating, modulator array.

The device array 200 may be an array of LCD elements, a suitable MEMS device array such as micro mirrors or cantilevers, an array of electro-optic modulators, an array of acousto-optic modulators or any light controlling device array. The preferred embodiment is based on using a deformable grating modulator array invented by Bloom et. al. (U.S. Pat. No. 5,311,360) as shown in FIGS. 2A,B. The device is comprised of ribbons 199 of width w suspended above the substrate 198. The top surface of the ribbon is a height d above the substrate. Ribbons are electrically connected and driven in pairs. Each pair controls a spectral slice. 201 controls $\lambda 1$, 202 controls $\lambda 2$, and so on till 20n controls $\lambda n$. The gap between the ribbons is also w. All ribbons and gaps are covered with a reflective layer which may be aluminum or gold. For operation at a given wavelength $\lambda$, $d=m\lambda/2$ where m is an integer. Now light reflected from the ribbons and the gaps is in phase and device looks like a mirror. By applying a voltage to the ribbons, the electrostatic force starts pulling the ribbons downwards and light starts diffracting. At a maximum deflection of $\lambda/4$, all the light is diffracted out and the element is effectively off. Two pairs of ribbon/gap provides enough isolation for a single-mode fiber. However more pairs can also be used. For a range of wavelength, $\lambda 1-\lambda n$, d is chosen based on the longest wavelength, $\lambda 1$, i.e. $d=m\lambda 1/2$. In practice, m=3 is a suitable choice. For the EDFA application $\lambda 1=1575$ nm, therefore d=2362 nm. The shorter wavelength elements will start out with the ribbons already slightly pulled in. In FIG. 1, the choice of focal lengths f1, f2 and the grating use determines the spot size on the device array which in turn determines the ribbon width w, i.e. spot size=4 w. The spectral resolution of the system is determined by f1, f2, grating pitch and the grating incident angle. The resolution should be such that going from $\lambda 1$ to $\lambda 2$ moves the spot across the device array by w.

Figure 3A:
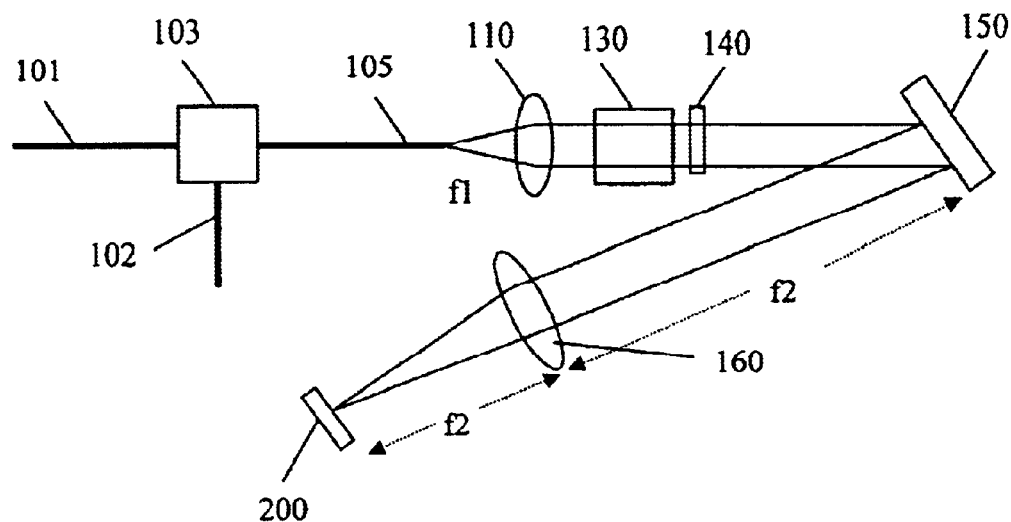
FIG. 3(a) is a schematic top view of a modified FIG. 1(a) optical system that includes a circulator to extract the output light.
Figure 3B:
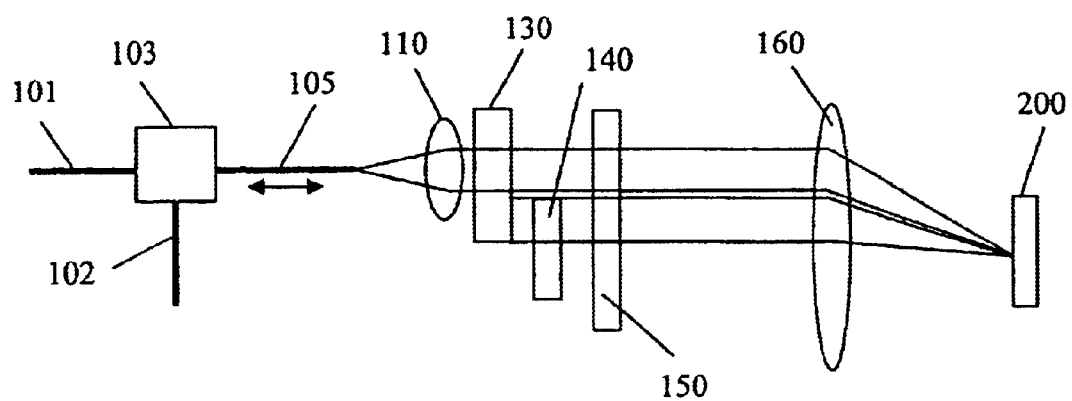
FIG. 3(b) is a schematic side view of the FIG. 3(a) optical system with circulator.

An alternate embodiment of the optical system 300 is shown in FIGS. 3A,B, which is the same as system 100 in FIG. 1, except a circulator 103 is used to separate out the light in the input fiber 101 from the output fiber 102.

Figure 4A:
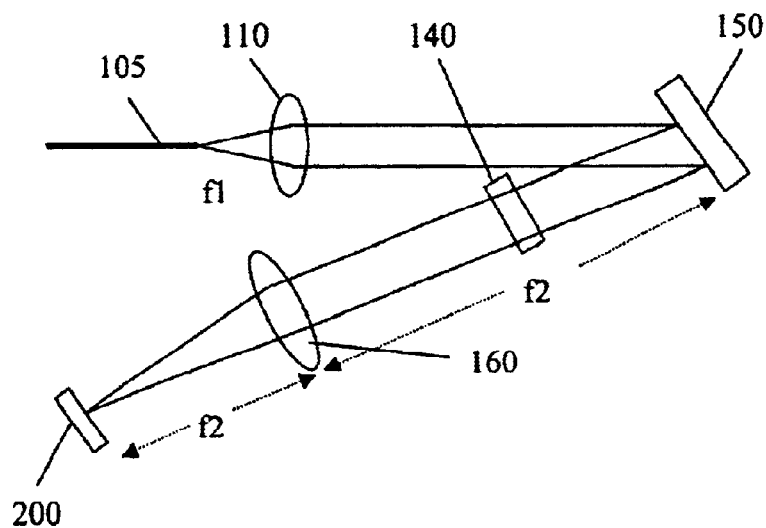
FIG. 4(a) is a schematic top view of a modified FIG. 1(a) optical system that includes of a quarter-wave plate to minimize PDL.
Figure 4B:
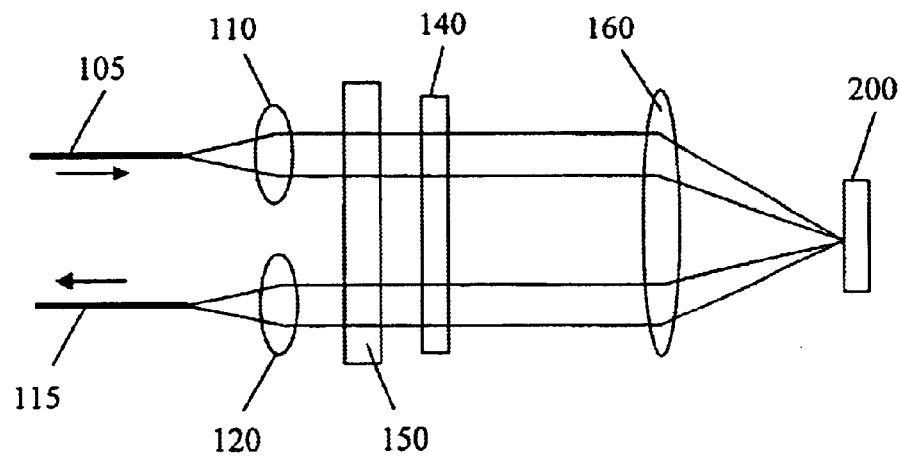
FIG. 4(b) is a schematic side view of the FIG. 4(a) optical system.

Yet another embodiment of the optical system 400 is shown in FIGS. 4A,B. This is again similar to system 100 shown in FIG. 1 except that polarization splitting is not employed. Since both polarizations are impinging on the grating 150, it is desirable that the grating have high diffraction efficiency for both polarizations. After diffracting from the grating, a quarter wave plate (QWP) 140 is employed to flip the vertical and horizontal polarizations on the return path. This reduces the polarization dependent loss (PDL) for the overall system assuming the device array 200 does not have any significant PDL. If PDL from the device array needs to be minimized further, the polarization independent grating modulator invention of Godil et. al. (include by cross-reference) can be used here configured as an array of elements. Another variation of this embodiment would be to use a circulator on the input side to separate out the output fiber from the input without creating a separate path.

Figure 5:
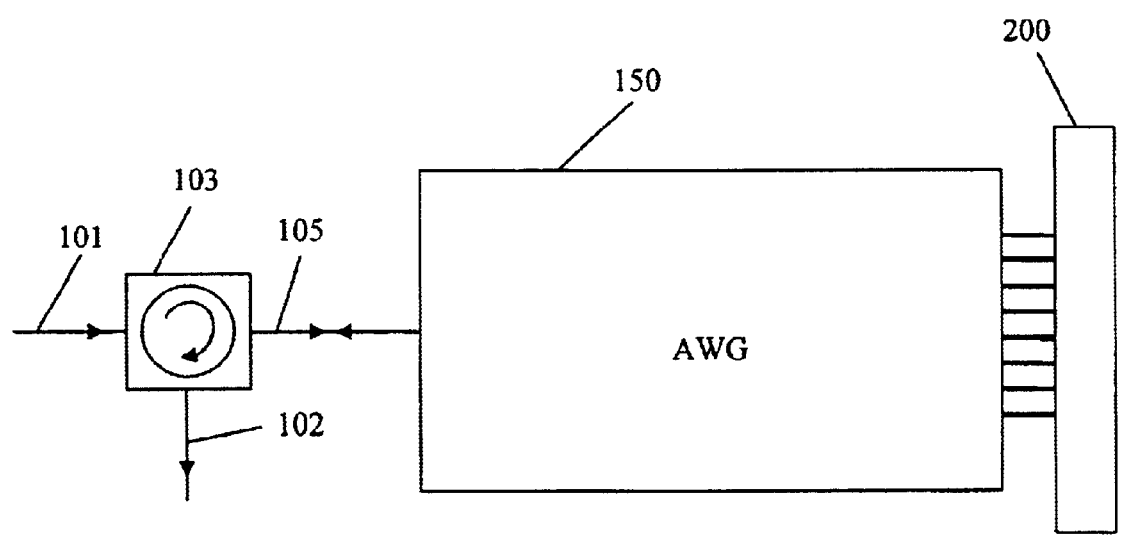
FIG. 5 is a schematic top view of one embodiment of an optical system of the present invention that is utilized for dynamic spectral shaping and incorporates an array waveguide grating.

Another embodiment of the present invention is disclosed in FIG. 5. In this embodiment, dispersive element 150 is an arrayed waveguide grading ("AWG"). A suitable AWG 150 is manufactured by Lightwave Microsystems, San Jose, Calif. In this embodiment, device array 200 which can be a controllable, deformable grating modulator, can be placed in close proximity to the dispersed output at AWG 150. This proximity is selected to provide good coupling efficiency back into the waveguides of AWG 150. The maximum distance depends on the size of the waveguides of AWG 150. In a preferred embodiment, the distance is 10 microns or less and can be butt-coupled. With this combination, AWG 150 disperses the light from the input optical fiber 105 and spreads the input beam in at least one dimension as a function of wavelength where it impinges on device array 200. The spatially dispersed light is reflected back into AWG 150 which subsequently recombines the light into optical fiber 105 but in a counterpropagating direction to the input. The output light can be extracted by circulator 103. Other embodiments can include a separate output port and do not require the circulator.

The forgoing description of the invention has been presented for purposes of illustration and description. It is not intended to be exhaustive or to limit the invention to the precise forms disclosed. Obviously, many modifications and variations will be apparent to practitioners skilled in this art.

What is claimed is:

1. A dynamic spectral shaping device with a controllable transmission as a function of wavelength, comprising:
    a fiber optic input port providing an input beam;
    a wavelength dispersive element coupled through free space to the input port, the wavelength dispersive element spreading the input beam in at least one dimension as a function of wavelength and generating a dispersed beam;
    a controllable grating reflecting the dispersed beam to the wavelength dispersive element and generating a recombined beam, the controllable grating providing a controllable reflectivity as a function of wavelength; and a fiber optic output port positioned to receive the recombined beam.

2. The device of claim 1, wherein the controllable grating is an array with a diffraction efficiency that is controlled as a function of position on the array.

3. The device of claim 1, wherein the controllable grating is an array of ribbons.

4. The device of claim 1, wherein the controllable grating is a micromachined grating device.

5. The device of claim 1, further comprising:
a first lens positioned between the fiber optic input port and the wavelength dispersive element.

6. The device of claim 1, further comprising:
a second lens positioned between the wavelength dispersive element and the controllable grating.

7. The device of claim 1, further comprising:
a birefringent plate positioned between the fiber optic input port and the wavelength dispersive element.

8. The device of claim 1, further comprising:
a half-wave plate positioned between the fiber optic input port and the wavelength dispersive element.

9. The device of claim 1, further comprising:
a quarter-wave plate positioned between the wavelength dispersive element and the controllable grating.

10. The device of claim 1, further comprising:
a second birefringent plate positioned between the wavelength dispersive element and the fiber optic output port.

11. An optical system, comprising:
an EDFA system including at least one amplifier stage;
a spectral shaping device coupled to the EDFA system, the spectral shaping device including:
a fiber optic input port providing an input beam;
a wavelength dispersive element coupled through free space to the input port, the wavelength dispersive element spreading the input beam in at least one dimension as a function of wavelength and generating a dispersed beam;
a controllable grating reflecting the dispersed beam to the wavelength dispersive element and generating a recombined beam, the controllable grating providing a controllable reflectivity as a function of wavelength;
a fiber optic output port positioned to receive the recombined beam; and wherein the optical system provides a desired controllable wavelength flatness.

12. The system of claim 11, wherein the at least one amplifier stage of the EDFA system is coupled to the fiber optic output port.

13. The system of claim 11, wherein the at least one amplifier stage of the EDFA system is coupled to the fiber optic input port.

14. The system of claim 11, wherein at least a portion of the spectral shaping device is incorporated in the EDFA system.

15. An optical system, comprising:
a fiber optic input port providing an input beam;
a wavelength dispersive element coupled through free space to the input port, the wavelength dispersive element spreading the input beam in at least one dimension as a function of wavelength and generating a dispersed beam;
a controllable grating reflecting the dispersed beam to the wavelength dispersive element and generating a recombined beam, the controllable grating providing a controllable reflectivity as a function of wavelength;
a fiber optic output port positioned to receive the recombined beam; and
an EDFA coupled to the fiber optic input port, wherein the optical system provides a desired controllable wavelength flatness.

* * * * *